United States Patent [19]

Hata et al.

[11] Patent Number: 4,708,232

[45] Date of Patent: Nov. 24, 1987

[54] MOVING TABLE TYPE WORK SYSTEM

[75] Inventors: Kanji Hata; Eiji Itemadani; Masahiro Maruyama, all of Osaka, Japan

[73] Assignee: Matsushita Electric Industrial Co., Ltd., Japan

[21] Appl. No.: 842,362

[22] Filed: Mar. 19, 1986

[30] Foreign Application Priority Data

Mar. 20, 1985 [JP] Japan .................................. 60-56742

[51] Int. Cl.[4] ............................................. B65G 47/52
[52] U.S. Cl. ............................... 198/346.1; 198/465.1; 29/33 P
[58] Field of Search ...................... 414/222; 198/346.1, 198/346.2, 465.1, 465.2, 465.3, 487.1; 29/33 P, 563

[56] References Cited

U.S. PATENT DOCUMENTS

| 913,285 | 2/1909 | Harbeck | 198/487.1 |
| 2,907,446 | 10/1959 | Davis | 198/465.3 |
| 3,530,571 | 9/1970 | Perry | 198/346.3 X |
| 4,072,227 | 2/1978 | Nomura et al. | 198/487.1 X |

FOREIGN PATENT DOCUMENTS 57-144691 9/1982 Japan .

Primary Examiner—Robert J. Spar
Assistant Examiner—Jay I. Alexander
Attorney, Agent, or Firm—Lowe, Price, LeBlanc, Becker & Shur

[57] ABSTRACT

A moving table type work system includes a work table (3) arranged to provide the movements of two degrees of freedom for a work piece (a) to carry out a predetermined work for the work piece (a). Further included are a feeding table (1) which is reciprocated between the work table (3) and a work piece feeding device (2) to transfer the work piece (a) from the work piece feeding device (2) to the work table (3) and a discharging table (4) which is also reciprocated between the work table (3) and a work piece receiving device (5) to transfer the work piece (a) from the work table (3) to the work piece receiving device (5). The feeding table (1) is controlled to be in unitary movement relation to the work table (3) while the feeding table (1) is connected to the work table (3) so that the work piece (a) is transferred to the work table (3) therefrom and the discharging table (4) is also controlled to come into unitary movement with the work table (3) while it is connected to the work table (3) so that the work piece (a) is shifted from the work table (3) thereto.

8 Claims, 4 Drawing Figures

MOVING TABLE TYPE WORK SYSTEM

BACKGROUND OF THE INVENTION

The present invention relates to a moving table type work system, and it particularly pertains, but not exclusively, to a work system for sequentially mounting electronic parts on predetermined portions of a work piece such as substrate.

One example of such work systems for sequentially mounting electronic parts on predetermined portions of a substrate is disclosed in Japanese Patent Provisional Publication No. 57-144691, in which a work table is provided which allows the movements with two degrees of freedom for a substrate and electronic parts are sequentially mounted on predetermined portions of a substrate by means of an electronic part mounting device. The work table is arranged to be reciprocated between feeding/discharging positions and a working position so that a substrate is fed from the substrate feeding section at a substrate feeding position and coincidentally an electronic part-mounted substrate is discharged to a substrate discharging section at a substrate discharging position.

However, such prior art system would suffer a problem that the electronic part mounting operations are interrupted while the work table is parted from the working position for the substrate feeding/discharging operations, that is, for a time period required for the reciprocating movement thereof and the feeding/discharging of the substrates. This work interruption period causes the lowering in working ratio of the system.

SUMMARY OF THE INVENTION

The present invention has been developed in order to eliminate the above-described disadvantages inherent in the prior art work systems.

It is therefore an object to provide a new and improved work system which is capable of successively performing the work, such as electronic part mounting operation, without interruption of the work.

According to a feature of the present invention, included in the work system are a feeding table which is reciprocated between the work table and a work piece feeding device to transfer a work piece from the work piece feeding device to the work table and a discharging table which is also reciprocated between the work table and a work piece receiving device to transfer the work piece from the work table to the work piece receiving device. The feeding table is controlled to be in unitary movement relation to the work table while the feeding table is connected to the work table so that the work piece is transferred to the work table therefrom and the discharging table is also controlled to come into unitary movement with the work table while it is connected to the work table so that the work piece is shifted from the work table thereto.

This feature not only makes possible to efficiently and accurately perform the transferring of the work piece between the feeding table and the work table and between the discharging table and the work table, but also makes possible to take advantage of successively performing the work without interruption.

In accordance with the present invention, there is provided a table moving type work system comprising: work-piece feeding means for sending out a work piece; work table means provided for carrying out a work for the work piece thereon; feeding table means for transferring the work piece fed from the work-piece feeding means to the work table means, the feeding table means being reciprocated between the work-piece feeding means and the work table means and coming into unitary movement with the work table means when the feeding table means is connected to the work table means so that the work piece is shifted from the feeding table means to the work table means; work-piece receiving means for receiving the work piece; and discharging table means for transferring the work piece from the work table means to the work-piece receiving means, the discharging table means being reciprocated between the work-piece receiving means and the work table means and coming into unitary movement with the work table means when the discharging table means is connected to the work table means so that the work piece is shifted from the work table means to the discharging table means.

In accordance with the present invention, there is further provided a work system for sequentially mounting electronic parts on predetermined portions of a substrate, comprising: substrate feeding means for sending out the substrate; work table means arranged to successively provide movements of two degrees of freedom for the substrate so that the electronic parts are mounted on the predetermined portions of the substrate; feeding table means arranged to be reciprocated between the substrate feeding means and the work table means so that the substrate is transferred from the substrate feeding means to the work table means; substrate receiving means for receiving the substrate on which the electronic parts are mounted on the work table; discharging table means arranged to be reciprocated between the substrate receiving means and the work table means so that the substrate with the electronic parts is transferred from the work table means to the substrate receiving means; and control means for controlling movements of the work table means, the feeding table means, and the discharging table means through motor means thereof, the control means controlling the feeding table means to come into unitary movement with the work table means when the feeding table means is connected to the work table means to transfer the substrate fed from the substrate feeding means to the work table means; the control means controlling the discharging table means to come into unitary movement with the work table means when the discharging table means is connected to the work table means so that the substrate with electronic parts is shifted from the work table means to the discharging table means.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals and characters throughout the drawings.

DETAILED DESCRIPTION OF THE INVENTION

Figure 1:
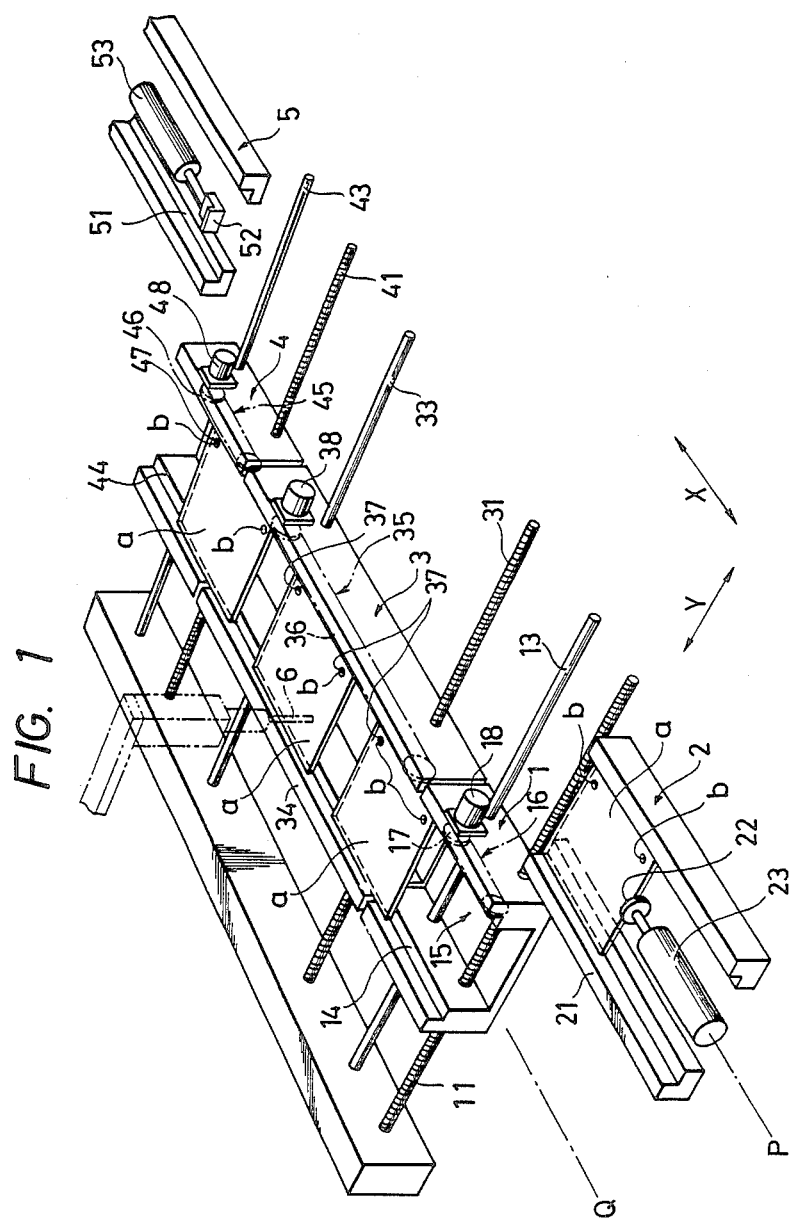
FIG. 1 is a perspective view showing a work system according to an embodiment of the present invention.
Figure 2:
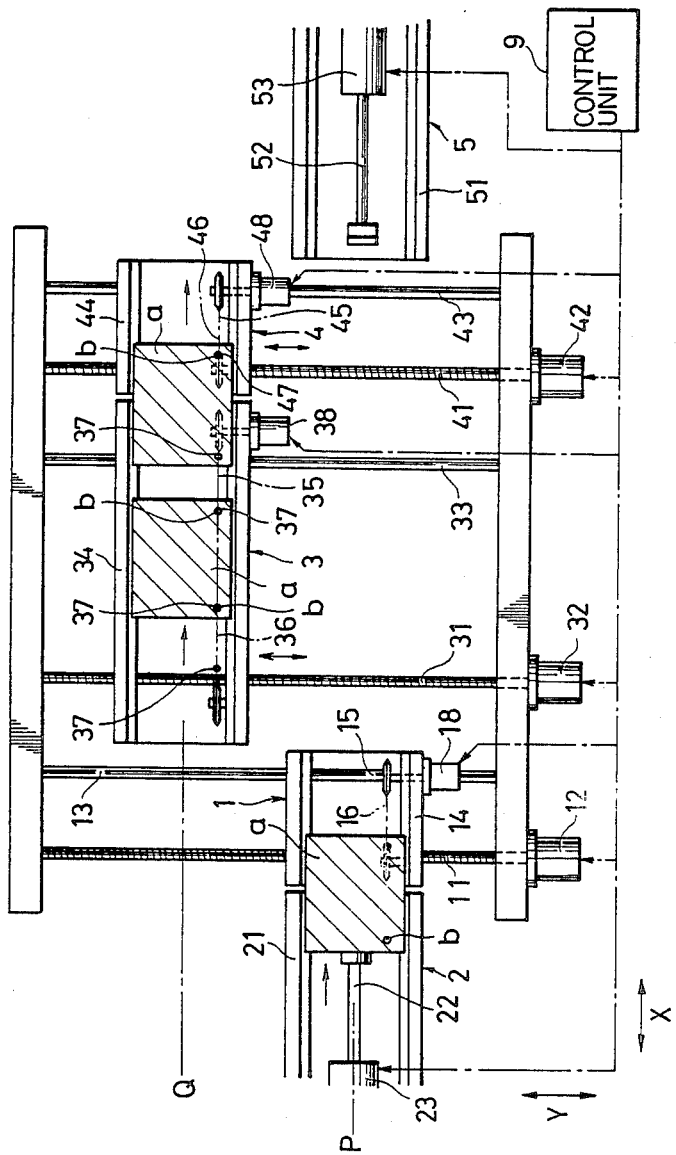
FIGS. 2 and 3 are respectively plan views useful for understanding the operation of the work system of FIG. 1.
Figure 3:
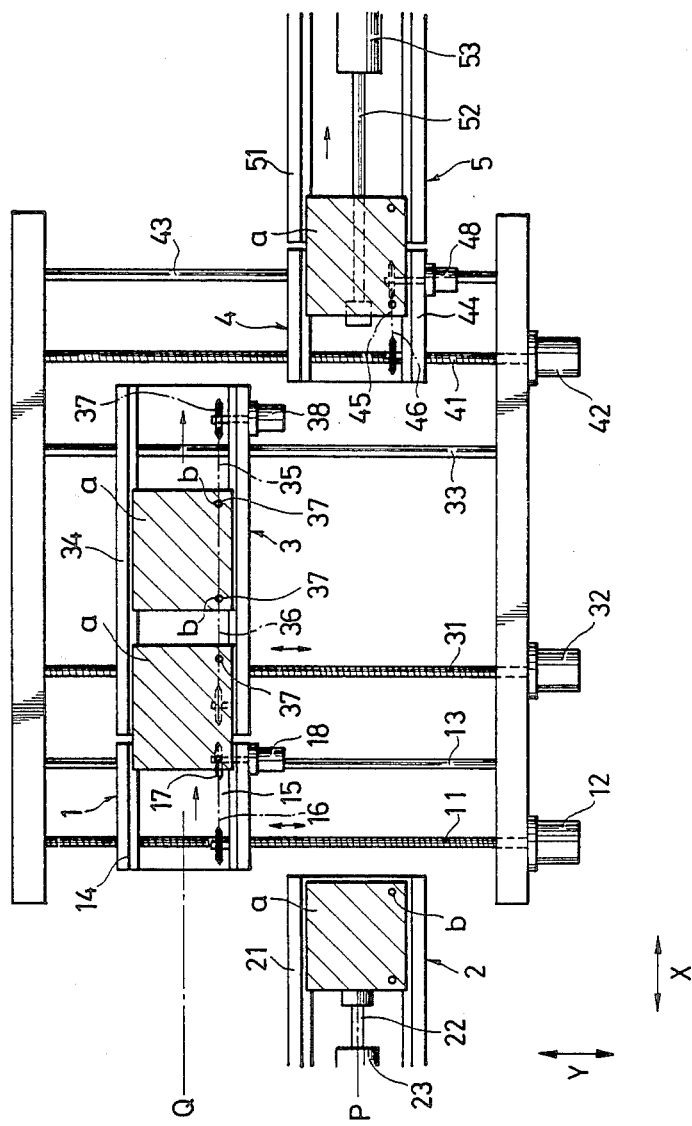

Referring now to FIGS. 1 through 3, there is illustrated a work system for sequentially mounting electronic parts on predetermined portions of a work piece such as a substrate. In the drawings, illustrated at the reference numeral 1 is a feeding table which is arranged to be reciprocated between a work piece feeding device 2 and a work table 3 along Y-axis in the drawings so that a work piece (substrate) a fed from the work piece feeding device 2 is transferred to the work table 3. The work table 3 shifts the work piece a transferred from the feeding table 1, in the X-axis direction in the drawings, and is movable along the Y-axis of the drawings so that the work piece a can be moved with two degrees of freedom, i.e., along X-axis and Y-axis in the drawings.

A discharging table 4 reciprocates between the work table 3 and a work piece receiving device 5 along Y-axis in the drawings so that the work piece a shifted from the work table 3 is discharged to the work piece receiving device 5.

The work piece feeding device 2 includes a guide rail 21 disposed so that the work piece a stands ready for feed and an air cylinder 23 having a thrusting-out rod 22.

Figure 4:
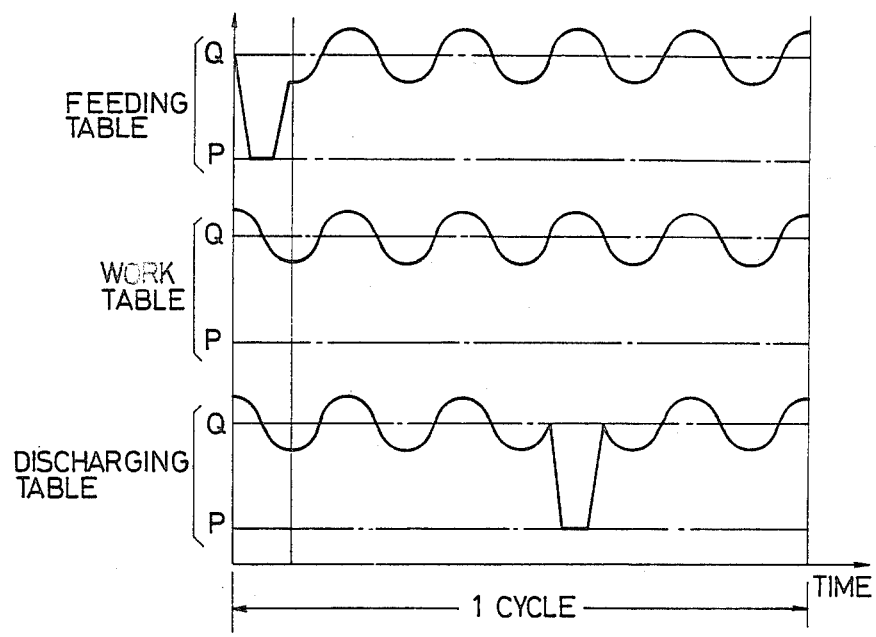
FIG. 4 is a time chart useful for describing the moving timings of respective tables of the work system.

The feeding table 1 is reciprocated between the work piece feeding device 2 and the work table 3, i.e., a feeding position P and a connecting position Q, which are predetermined with respect to a base of the work system, by means of a feed screw shaft 11 disposed along Y-axis. The feed screw shaft 11 is rotated by means of a motor 12 driven under control of a control unit 9 whereby the feeding table 1 is reciprocated. The movement of the feeding table 1 is shown in FIG. 4. The reference numeral 13 represents a guide rod. The feeding table 1 has a rail 14 for guiding the work piece a transferred from the work piece feeding device 2 at the feeding position P as shown in FIG. 2 and a work piece carrying device 15 for moving the work piece a into the work table 3 when it is coupled to the work table 3 at the connecting position Q as shown in FIG. 3. The work piece carrying device 15 comprises, for example, an endless chain 16 having a pushing tooth 17 which the endless chain 16 is driven by a motor 18 controlled by the control unit 9. The work piece a is transferred into the work table 3 by rotating the chain 16 in right direction in the drawings with high speed with the pushing tooth 17 being brought into contact with the rear end surface of the work piece a.

The work table 3 reciprocates with respect to a position, which is coincident with the connecting position Q, along the Y-axis by means of rotation of a feed screw shaft 31. The rotation of the feed screw shaft 31 is given by a motor 32, the operation of which is controlled by the control unit 9, and the work table 3 is controlled to cause the movements as shown in FIG. 4. The reference numeral 33 designates a guide rod. The work table 3 has a guide rail 34 for introducing the work piece a transferred from the feeding table 1 thereinto and a conveying device 35 for moving the work piece a in X-axis direction in the drawings. The conveying device 35 comprises, for example, an endless chain 36 having engaging pins and a motor 38 for driving the endless chain 36 under control of the control unit 9, and is arranged to provide an intermittent movement in X-axis direction for the work piece a with the engaging pin 37 being engaged with hole b defined in the work piece a, whereby the work table 3 is allowed to obtain the movements of two degrees of freedom. An electronic part mounting device 6 is disposed upward from the work table 3 so that electronic parts are sequentially mounted on predetermined portions of the work piece a. The mounting of the electronic parts to the work piece is performed from the right side of the work piece a to the left side thereof while the work piece a placed on the work table 3 moves in the right direction in the drawings.

The discharging table 4 is reciprocated between a connecting position (which is coincident with the working position Q in Y-axis direction) and a discharging position (which is coincident with the feeding position P in Y-axis direction) by rotation of a feed screw shaft 41. The rotation thereof is given by a motor 42 the operation of which is controlled by the control unit 9. The movement thereof is controlled as illustrated in FIG. 4. The reference numeral 43 represents a guide rod. The discharging table 4 has a guide rail 44 for introducing the work piece a shifted from the work table 3 and an introducing device 45 for receiving the work piece a transferred from the work table 3. In this embodiment illustrated, the introducing device 45 comprises an endless chain 46 having an engaging pin 47 and a motor 48 for driving the endless chain under control of the control unit 9. The work piece a is transfered from the work table 3 to the discharging table 4 by rotating in the right direction in the drawings with high speed with the engaging pin 47 being engaged with the engaging hole b of the work piece a being transferred.

The work piece receiving device 5 includes an air cylinder 53 having a drawing rod 52 for drawing the work piece a discharged. Also included is a guide rail 51 for once maintaining the work piece a. The air cylinders 23 and 53 are respectively controlled by the control unit 9.

The control unit 9 comprises, for example, a microcomputer and the movements and operations of the respective tables and air cylinders are controlled in accordance with the program stored in a Read-only memory (ROM) of the microcomputer. FIG. 4 illustrates the movements of the feeding table 1, work table 3, and discharging table 4 which are controlled by the control unit 9.

As understood from FIG. 4, the feeding table 1 is reciprocated between the connecting position Q at which the feeding table 1 is connected to the work table 1 as illustrated in FIG. 3 and the feeding position P at which a work piece is transferred by the work piece feeding device 2 to the feeding table 1 during the electronic part mounting work so that a work piece a fed by the work piece feeding device is transferred to the feeding table 1. While the feeding table 1 is coupled to the work table 3 to shift the work piece a to the work table 3, the feeding table 1 and the work table 3 are moved together along Y-axis, that is, both are synchronized in movement and are in unitary movement.

The discharging table 4 is reciprocated between the connecting position Q at which the discharging table 4 is coupled to the work table 1 and the discharging position P at which the discharging table 4 is coupled to the work piece receiving device 5, during the electronic part mounting work so that a work piece a is transferred from the work table 3 to the work piece receiving device 5. While the discharging table 4 is coupled to the work table 3 to shift the work piece a from the work table 3 thereto, the discharging table 4 and the work table 3 are moved together along Y-axis, that is, both are synchronized in movement and comes into unitary movement.

This not only makes it possible to smoothly perform the transferring of the work piece, but also makes it possible to successively mount electronic parts on the work piece without interruption.

Note here that although the feeding table 1 and discharging table 3 are described in this embodiment as being reciprocated only along Y-axis in the drawings, the concept of the present invention is not necessarily limited to such movements and if required, the movement thereof can be replaced by other movements, for example, X-axis or X-axis and Y-axis with appropriate arrangement as long as they are respectively reciprocated between the work piece feeding device 2 and the work table 3 and between the work table 3 and the work piece receiving device 5.

It should be understood that the foregoing relates to only preferred embodiment of the present invention, and that it is intended to cover all changes and modifications of the embodiment of the invention herein used for the purpose of the disclosure, which do not constitute departures from th e spirit and scope of the invention.

What is claimed is:

1. A moving table type work system comprising:
   (a) work-piece feeding means for sending out a work piece;
   (b) work table means provided for performing a work operation on said work piece thereon, said work table means being arranged to provide two degrees of freedom for said work piece;
   (c) feeding table means for transferring said work piece fed from said work-piece feeding means to said work table means, said feeding table means being reciprocated in directions substantially perpendicular to the working direction of movement of said work piece on said work table means and coming initially into unidirectional unitary movement with said work table means in one of the directions that provide the two degrees of freedom for said work piece when said feeding table means is adjacent said work table means so that said work piece is shifted from said feeding table means to said work table means, whereby the two degrees of freedom is provided for said work piece without interruption during the shift of said work piece from said feeding table means to said work table means;
   (d) work-piece receiving means for receiving said work piece; and
   (e) discharging table means for transferring said work piece from said work table means to said work-piece receiving means, said discharging table means being reciprocated in directions substantially perpendicular to the working direction of movement of said work piece on said work table means and coming into unitary movement with said work table means in one of the directions that provide the two degrees of freedom for said work piece when said discharging table means is adjacent said work table means so that said work piece is shifted from said work table means to said discharging table means, whereby the two degrees of freedom is provided for said work piece without interruption during the shift of said work piece from work table means to said discharging table means.

2. A moving table type work system as claimed in claim 1, wherein said feeding means has a work piece carrying means for feeding said work piece from said feeding table means to said work table means when said feeding table means is connected to said work table means.

3. A moving table type work system as claimed in claim 2, wherein said work piece carrying means comprises an endless chain having a pushing tooth for pushing said work piece.

4. A moving table type work system as claimed in claim 1, wherein said discharging table means has a work piece introducing means for introducing said work piece from said work table means into said discharging table means when said discharging table means is connected to said work table means.

5. A moving table type work system as claimed in claim 4, wherein said introducing means comprises an endless chain having an engaging pin for engaging with a hole defined in said work piece.

6. A work system for sequentially mounting electronic parts on predetermined portions of a substrate, comprising:
   (a) substrate feeding means for sending out said substrate;
   (b) work table means arranged to successively provide movements of two degrees of freedom for said substrate so that said electronic parts are mounted on said predetermined portions of said substrate;
   (c) feeding table means arranged to be reciprocated between said substrate feeding means and said work table means so that said substrate is transferred from said substrate feeding means to said work table means;
   (d) substrate receiving means for receiving said substrate on which said electronic parts are mounted on said work table;
   (e) discharging table means arranged to be reciprocated between said substrate receiving means and said work table means so that said substrate with said electronic parts is transferred from said work table means to said substrate receiving means; and
   (f) control means for controlling movements of said work table means, said feeding table means, and said discharging table means through motor means thereof, said control means controlling said feeding table means to come into unitary movement with said work table means when said feeding table means is connected to said work table means to transfer said substrate fed from said substrate feeding means to said work table means, said control means controlling said discharging table means to come into unitary movement with said work table means when said discharging table means is connected to said work table means so that said substrate with electronic parts is shifted from said work table means to said discharging table means.

7. A moving table type work system comprising:
   (a) work-piece feeding means for sending out a work piece;
   (b) work table means provided for carrying out a work for said work piece thereon;
   (c) feeding table means for transferring said work piece fed from said work-piece feeding means to said table means, said feeding table means being reciprocated between said work-piece feeding means and said work table means and coming into unitary movement with said work table means when said feeding table means is connected to said work table means so that said work piece is shifted from said feeding table means to said work table means;

(d) work-piece receiving means for receiving said work piece; and (e) discharging table means for transferring said work piece from said work table means to said work-piece receiving means, said discharging table means being reciprocated between said work-piece receiving means and said work table means and coming into unitary movement with said work table means when said discharging table means is connected to said work table means so that said work piece is shifted from said work table means to said discharging table means, wherein said work means has an elongated configuration, and said feeding table means is reciprocated in the directions normal to the longitudinal direction of said work table means.

8. A moving table type work system comprising:
(a) work-piece feeding means for sending out a work piece;
(b) work table means provided for carrying out a work for said work piece thereon;
(c) feeding table means for transferring said work piece fed from said work-piece feeding means for said work table means, said feeding table means being reciprocated between said work-piece feeding means and said work table means and coming into unitary movement with said work table means when said feeding table means is connected to said work table means so that said work piece is shifted from said feeding table means to said work table means;
(d) work-piece recieving means for receiving said work piece; and
(e) discharging table means for transferring said work piece from said work table means to said work-piece receiving means, said discharging table means being reciprocated between said work-piece receiving means and said work table means and coming into unitary movement with said work table means when said discharging table means is connected to said work table means so that said work piece is shifted from said work table means to said discharging table means, wherein said work table means has an elongated configuration, and said discharging table means is reciprocated in the direction normal to the longitudinal direction of said work table means.

* * * * *